United States Patent [19]

Calviello et al.

[11] Patent Number: 4,923,827
[45] Date of Patent: May 8, 1990

[54] T-TYPE UNDERCUT ELECTRICAL CONTACT PROCESS ON A SEMICONDUCTOR SUBSTRATE

[75] Inventors: Joseph A. Calviello, Kings Park; Paul R. Bie, Commack; David Ward, Roslyn Heights, all of N.Y.

[73] Assignee: Eaton Corporation, Cleveland, Ohio

[21] Appl. No.: 194,533

[22] Filed: May 16, 1988

[51] Int. Cl.$^5$ .................................... H01L 21/283
[52] U.S. Cl. ............................ 437/190; 437/177; 437/179; 437/192; 437/947; 437/985; 148/DIG. 117; 148/DIG. 131; 148/DIG. 140; 357/22; 357/15
[58] Field of Search ............... 437/175, 176, 177, 178, 437/189, 180, 192, 190, 947, 985, 39, 40; 148/DIG. 117, DIG. 131, DIG. 140; 357/22, 15

[56] References Cited

U.S. PATENT DOCUMENTS

| | | | |
|---|---|---|---|
| 3,886,580 | 5/1975 | Calviello | 357/15 |
| 3,923,975 | 12/1975 | Calviello | 357/15 |
| 4,075,650 | 2/1978 | Calviello | 357/15 |
| 4,098,921 | 7/1978 | Calviello | 357/15 |
| 4,179,533 | 12/1979 | Christou et al. | 437/179 |
| 4,301,233 | 11/1981 | Calviello | 156/656 |
| 4,310,570 | 1/1982 | Calviello | 357/22 |
| 4,312,112 | 1/1982 | Calviello | 357/15 |
| 4,312,113 | 1/1982 | Calviello | 357/15 |
| 4,549,194 | 10/1985 | Calviello | 357/30 |
| 4,574,298 | 3/1986 | Yamagishi et al. | 357/71 |
| 4,601,096 | 7/1986 | Calviello | 357/15 |
| 4,620,207 | 10/1986 | Calviello | 357/15 |
| 4,624,004 | 11/1986 | Calviello | 357/22 |
| 4,630,081 | 12/1986 | Calviello | 357/6 |
| 4,631,560 | 12/1986 | Calviello | 357/6 |
| 4,650,543 | 3/1987 | Kishita et al. | 156/643 |
| 4,665,413 | 5/1987 | Calviello | 357/15 |
| 4,674,174 | 6/1987 | Kishita et al. | 437/179 |
| 4,674,177 | 6/1987 | Calviello | 357/15 |
| 4,683,642 | 8/1987 | Calviello | 437/40 |
| 4,692,997 | 9/1987 | Calviello | 437/238 |
| 4,701,996 | 10/1987 | Calviello | 437/44 |
| 4,724,220 | 2/1988 | Calviello | 437/24 |
| 4,735,913 | 4/1988 | Hayes | 437/192 |
| 4,789,645 | 12/1988 | Calviello et al. | 437/51 |

FOREIGN PATENT DOCUMENTS

| | | | |
|---|---|---|---|
| 0035919 | 3/1983 | Japan | 437/192 |
| 0046631 | 3/1983 | Japan | 437/175 |
| 0117172 | 7/1984 | Japan | 437/175 |

OTHER PUBLICATIONS

Imamura, et al., *Japanese Journal of Applied Physics*, vol. 23, No. 5, May 1984, pp. L342–L345.
Murai, et al., *Electronics Letters*, vol. 13, No. 11, May 26, 1977, pp. 316–318.
Takahashi, et al., *IEDM Tech. Dig.*, Dec. 6–8, 1976, pp. 214–217.
Tiwari, S., *IBM Technical Disclosure Bulletin*, vol. 27, No. 2, Jul. 1984, pp. 1348–1349.
Shappirio, et al., *Solid State Technology*, Oct. 1985, pp. 161–166.
Calviello, et al., "First Successful Fabrication of High-Performance All-Refractory-Metal (Ta-Au) GaAs FET Using Very Highly Doped N+-Layers and Nonalloyed Ohmic Contacts", *Electronics Letters*, May 8, 1986, vol. 22, No. 10, pp. 510–512.
Calviello, et al., "Quasi-Monolithic: An Alternative/Intermediate Approach to Fully Monolithic" *Microwave Journal*, May, 1986, pp. 243–258.

*Primary Examiner*—Brian E. Hearn
*Assistant Examiner*—T. N. Quach
*Attorney, Agent, or Firm*—Andrus, Sceales, Starke & Sawall

[57] ABSTRACT

On a semiconductor substrate (38) T-type undercut electrical contact structure (12, 36) and methodology provides a diffusion barrier (26, 40) preventing migration therethrough from a gold layer (30, 48) along the sides of an undercut schottky metal lower layer (28, 44) into the active region of the semiconductor substrate. In one embodiment, the diffusion barrier (26) is provided at the base of the gold layer (30). In another embodiment, the gold layer (48) is encapsulated by the diffusion barrier (40) on the bottom (46) and sides (56). The diffusion barrier base layer is deposited. The diffusion barrier side layers are electroplated with the remaining portions of the contact structure being masked by selective oxidation.

8 Claims, 2 Drawing Sheets

T-TYPE UNDERCUT ELECTRICAL CONTACT PROCESS ON A SEMICONDUCTOR SUBSTRATE

BACKGROUND AND SUMMARY

The invention relates to T-type undercut electrical contact structure and methodology for fabrication on a semiconductor substrate.

To achieve low contact resistance, particularly low gate resistance in the case of a FET, a T-type undercut contact structure is used, as shown in FIG. 1. In the case of high frequency FET's, e.g. operating at millimeter wavelengths, the schottky metal first layer thickness is in the range of 1,000 to 1,500 angstroms, and the gold second layer thickness is in the 3,000 to 10,000 angstrom range. In such configuration, the gold can easily migrate along the side walls of the schottky metal and into the active semiconductor layer, as shown by the arrows in FIG. 2, causing device degradation and ultimately device failure. The migration of gold can be initiated as well as enhanced by the applied electric field, and further enhanced by the close spacing, e.g. 1,500 angstroms, at the undercut separating the gold from the semiconductor surface. The reason for the undercut is to define submicron gate length, e.g. less than about 0.5 microns, while retaining the low resistance requirement needed to achieve high performance and capability of operating at millimeter wavelengths.

The present invention overcomes the above noted difficulties, while retaining the design features of the T-type undercut contact structure. In a first preferred embodiment, a diffusion barrier is provided at the base of the gold layer to prevent it from diffusing into the semiconductor active layer. In a further preferred embodiment, the gold layer is encapsulated on the bottom and sides by a diffusion barrier.

DETAILED DESCRIPTION

Figure 1:
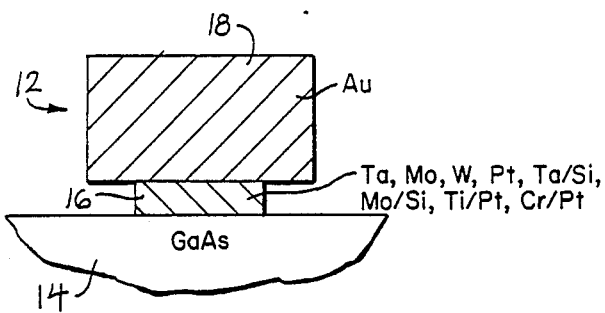
FIG. 1 shows T-type undercut electrical contact structure on a semiconductor substrate, as known in the prior art.
Figure 2:
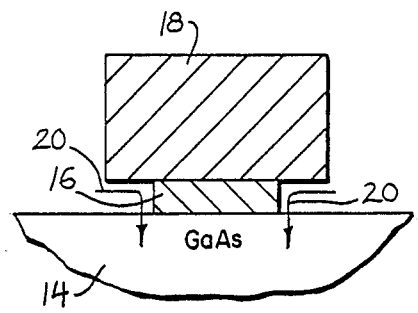
FIG. 2 is like FIG. 1 and shows migration of gold from the upper layer along the schottky metal layer into the semiconductor substrate.

FIG. 1 shows T-type undercut electrical contact structure 12 on a gallium arsenide n conductivity semiconductor substrate 14, as known in the prior art. The contact structure includes a first layer 16 on the substrate, which layer in the case of a FET gate contact is typically tantalum, molybdenum, tungsten, platinum, tantalum silicide, molybdenum silicide, titanium platinum, chromium platinum, or other silicides or nitrides thereof. A second layer 18, usually gold, is provided on first layer 16 and extends laterally therebeyond. As above noted, layer 16 is undercut to define submicron gate length. For further reference as to T-type undercut contact structure and metallurgies, reference is made to U.S. Pat. Nos. 4,301,233, 4,310,570, 4,312,112, 4,312,113, incorporated herein by reference, and to Electronics Letters, Volume 22, No. 10, May 1986, pp. 510-512.

The structure of FIG. 1 is subject to migration of gold from layer 18 along the sides of layer 16 into semiconductor substrate 14, as shown at arrows 20. The present invention addresses and solves this problem.

Figure 3:
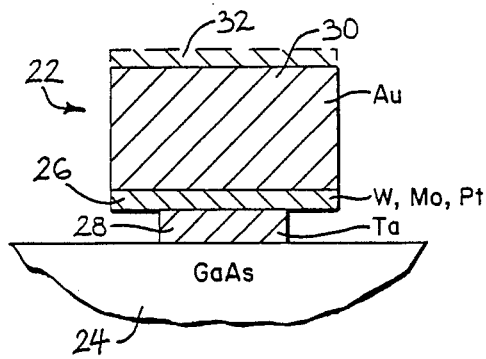
FIG. 3 shows T-type undercut electrical contact structure on a semiconductor substrate in accordance with the invention.

FIG. 3 shows T-type undercut electrical contact structure 22 on a gallium arsenide n conductivity semiconductor substrate 24, with a diffusion barrier 26 preventing the above noted migration. A first metal layer 28 is deposited on the substrate, followed by deposition of a second metal layer 26 on the first layer, followed by deposition of a third metal layer 30 on second layer 26, followed by deposition of a fourth metal layer 32 on third layer 30. Layer 28 is tantalum. Layer 26 is selected from the group consisting of tungsten, molybdenum, platinum and silicides and nitrides thereof. Layer 30 is gold. Layer 32 is tantalum. After deposition of the four layers, the device is masked, and etched with carbon tetraflouride and oxygen to remove portions of layer 32 outside of a given contact area, for which further refernce may be had to the above-noted Electronics Letters reference. Portions of layers 30 and 26 outside the contact area are then removed by an argon oxide etch. Portions of layer 28 outside the contact area and the remainder of layer 32 within the contact area are then removed with a carbon tetraflouride and oxygen etch. This last step is continued, but at a higher pressure, to remove the undercut portions of layer 28 beneath layers 26 and 30, for which further reference may be had to the above-noted Electronics Letters reference. In the final structure, layer 32 is thus no longer present.

Figure 4:
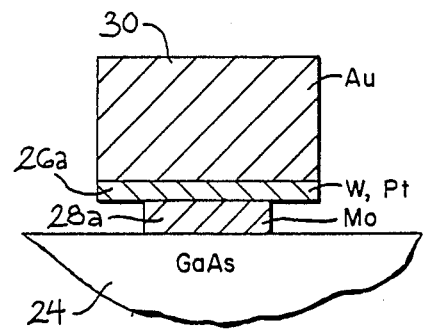
FIG. 4 shows an alternate embodiment of the contact of FIG. 3.

In an alternate embodiment as shown in FIG. 4, third layer 30 is gold, second layer 26a is selected from the group consisting of tungsten, platinum and nitrides and silicides thereof, and first layer 28a is selected from the group consisting of molybdenum and nitrides and silicides thereof. The portions of layers 30 and 26a outside the contact area are removed by argon oxide etchant. The portions of layer 28a outside the contact area and the portions of layer 28a within the contact area beneath layers 26a and 30 are removed by argon oxide etchant of higher oxygen content to provide faster etching of layer 28a than layers 26a and 30, to provide the undercut.

Figure 5:
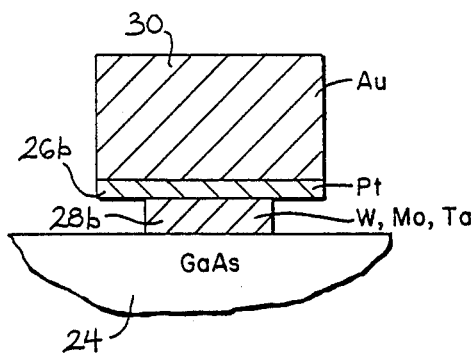
FIG. 5 shows another alternate embodiment of the contact of FIG. 3.

In FIG. 5, third layer 30 is gold, second layer 26b is platinum, and first layer 28b is selected from the group consisting of tungsten, molybdenum, tantalum and nitrides and silicides thereof. In one form, layer 28b is tungsten or molybdenum or a nitride or silicide thereof, and the portions of layers 30 and 26b outside the contact area are removed by argon oxide etchant, and the portions of layer 28b outside the contact area and the portions of layer 28b within the contact area beneath layers 26b and 30 are removed by argon oxide etchant of higher oxygen content to cause faster etching of layer 28b, to provide the undercut.

Figure 6:
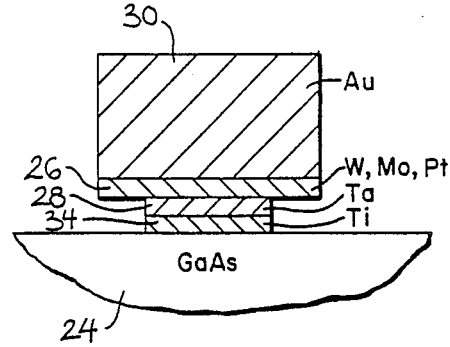
FIG. 6 shows another alternate embodiment of the contact of FIG. 3.

FIG. 6 shows a further embodiment comprising an initial sublayer of titanium 34 on the substrate beneath tantalum layer 28. The titanium is etched during the same step as etching of the tantalum by the carbon tetraflouride and oxygen etchant. The titanium is optional and provides better thermal expansion matching and better stress relief.

Figure 7:
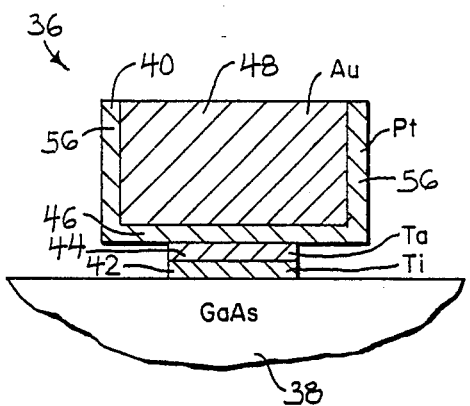
FIG. 7 shows T-type undercut electrical contact structure on a semiconductor substrate, with the contact structure encapsulated on the bottom and sides by a diffusion barrier, in accordance with the invention.

FIG. 7 shows further T-type undercut electrical contact structure 36 on a gallium arsenide n conductivity semiconductor substrate 38, with the contact structure encapsulated on the bottom and sides by a diffusion barrier 40.

Figure 8:
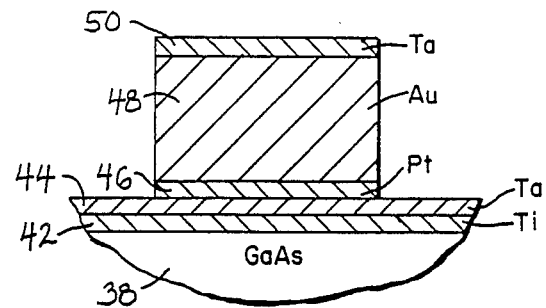
FIGS. 8-10 illustrate sequential processing steps to achieve the structure of FIG. 7.
Figure 9:
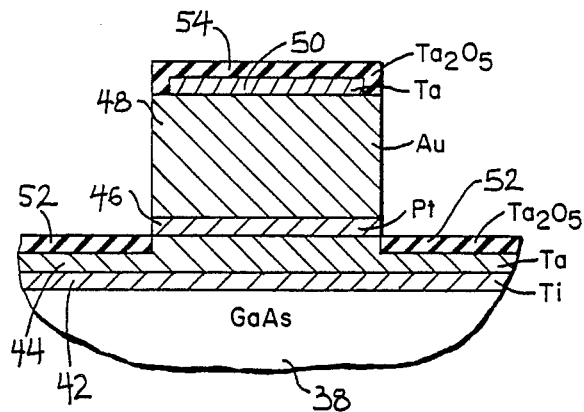
Figure 10:
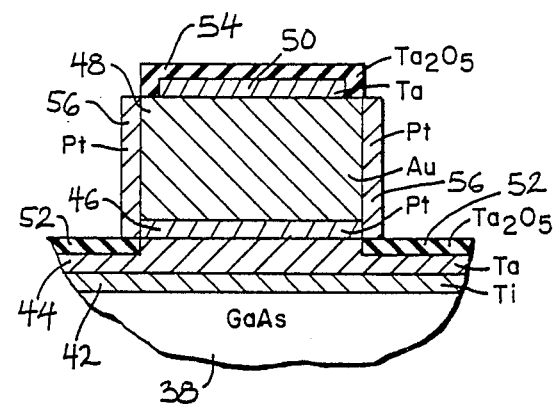

FIGS. 8-10 show the processing sequence to achieve the structure of FIG. 7. An initial titanium sublayer 42 may optionally be provided on the substrate for better thermal expansion matching and better stress relief. An oxidizable metal layer 44 is then deposited on the substrate, followed by deposition of non-oxidizable metal layer 46, followed by deposition of non-oxidizable metal layer 48, followed by deposition of oxidizable metal layer 50. Layers 44 and 50 are tantalum. Layer 46 is platinum. Layer 48 is gold. Layer 46 provides a diffusion barrier against migration therethrough from gold layer 48. The device is then masked, and etched with a carbon tetraflouride and oxygen etchant to remove portions of tantalum layer 50 outside of a given contact area. Portions of gold layer 48 and platinum layer 46 outside of the contact area are then removed with an argon oxide etchant, yielding the structure in FIG. 8. The device is then oxidized such that the portions of layer 44 outside of the contact area and the remainder of layer 50 within the contact area are oxidized to tantalum oxide as shown as portions 52 and 54, FIG. 9. Platinum metal side layers 56 are then electroplated on the sides of metal layers 48 and 46 between layers 44 and 50, and provide a diffusion barrier against migration therethrough from gold layer 48, FIG. 10. During the electroplating, oxidized portions 52 and 54 prevent plating of platinum thereto. The portions of layer 44 and its oxide film 52 outside the contact area, and the remainder of layer 50 and its oxide film 54 within the contact area, and the portions of layer 44 within the contact area undercut beneath layers 46 and 48, are then removed with a carbon tetraflouride and oxygen etchant. Such etch also removes the respective portions of titanium sublayer 42 if present. The result is the structure shown in FIG. 7, with diffusion barrier 40 provided by deposited platinum layer 46 along the bottom of gold layer 48, and electroplated platinum side layers 56 along the sides of gold layer 48.

It is recognized that various equivalents, alternatives and modifications are possible within the scope of the appended claims.

We claim:

1. A process for fabricating T-type undercut electrical contact structure on a semiconductor substrate, with said contact structure encapsulated on the bottom and sides by a diffusion barrier, comprising:

depositing a first metal layer on said substrate, said first metal layer being oxidizable;

depositing a second metal layer on said first metal layer;

depositing a third metal layer on said second metal layer, said third metal layer being non-oxidizable, said second metal layer being a material providing a diffusion barrier against migration therethrough from said third metal layer;

depositing a fourth metal layer on said third metal layer, said fourth metal layer being oxidizable;

removing portions of said fourth metal layer outside of a given contact area;

removing portions of said third metal layer outside said contact area;

removing portions of said second metal layer outside said contact area;

oxidizing portions of said first metal layer outside said contact area and oxidizing the remainder of said fourth metal layer within said contact area;

electroplating a fifth metal layer on the sides of said third metal layer between said second and fourth metal layers, said fifth metal layer being a material providing a diffusion barrier against migration therethrough from said third metal layer;

removing said portions of said first metal layer outside said contact area and removing said remainder of said fourth metal layer within said contact area, and also removing portions of said first metal layer within said contact area undercut beneath said second and third layers.

2. The invention according to claim 1 wherein said second metal layer is non-oxidizable, and comprising electroplating said fifth metal layer on the sides of said second and third metal layers between said first and fourth metal layers.

3. The invention according to claim 1 wherein said second and fifth layers are of the same material.

4. The invention according to claim 3 wherein said first and fourth layers are of the same material.

5. The invention according to claim 4 wherein said first and fourth layers are etched by a first etchant during said respective removing steps, and wherein said second layer is of a different material and is etched by a second different etchant during said respective removing step.

6. The invention according to claim 5 wherein said third layer is of a further different material than said first and second layers and is etched by said second etchant during said respective removing step.

7. The invention according to claim 1 wherein said first and fourth layers are tantalum, said second and fifth layers are platinum, and said third layer is gold.

8. The invention according to claim 7 further comprising a titanium sublayer on said substrate beneath said first layer of tantalum.

* * * * *